United States Patent
Daniels et al.

(10) Patent No.: US 6,947,272 B2
(45) Date of Patent: Sep. 20, 2005

(54) INRUSH CURRENT CONTROL METHOD USING A DUAL CURRENT LIMIT POWER SWITCH

(75) Inventors: David G. Daniels, Dallas, TX (US); Aiman Alhoussami, Plano, TX (US); Tom L. Fowler, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 297 days.

(21) Appl. No.: 10/282,337

(22) Filed: Oct. 28, 2002

(65) Prior Publication Data

US 2003/0095368 A1 May 22, 2003

Related U.S. Application Data

(60) Provisional application No. 60/331,804, filed on Nov. 20, 2001.

(51) Int. Cl.[7] ................................................. H02H 3/08
(52) U.S. Cl. ...................................... 361/93.9; 361/93.7
(58) Field of Search ........................ 361/18, 93.7, 93.8, 361/93.9, 94, 101, 103

(56) References Cited

U.S. PATENT DOCUMENTS

| | | | | |
|---|---|---|---|---|
| 4,731,574 A | * | 3/1988 | Melbert | .................. 323/275 |
| 4,736,267 A | * | 4/1988 | Karlmann et al. | .......... 361/101 |
| 4,937,697 A | * | 6/1990 | Edwards et al. | .............. 361/18 |
| 5,053,911 A | * | 10/1991 | Kopec et al. | ................ 361/154 |
| 5,375,029 A | * | 12/1994 | Fukunaga et al. | .......... 361/101 |
| 5,747,975 A | * | 5/1998 | Colandrea et al. | .......... 323/276 |
| 6,127,882 A | * | 10/2000 | Vargha et al. | .............. 327/540 |
| 6,667,652 B2 | * | 12/2003 | Hosoki | ........................ 327/538 |

* cited by examiner

Primary Examiner—Brian Sircus
Assistant Examiner—Danny Nguyen
(74) Attorney, Agent, or Firm—Alan K. Stewart; W. James Brady, III; Frederick J. Telecky, Jr.

(57) ABSTRACT

A current limit circuit regulates the current flow through a power switch 90 by measuring the current through the switch 90 and comparing it to a reference voltage $V_{REF}$ that represents the limit current. When the current through the power switch 90 is greater than the limit current, the current in the power switch 90 is pulled lower by a driver circuit 92 which controls the power switch 90. By using a current limit reference voltage that has two levels, the power switch 90 has two current limit thresholds. Using a comparator 94 to compare the input voltage of the power switch 90 to the output voltage of the power switch 90, an output signal is generated to control the current limit threshold. When the input voltage and output voltage has a large differential voltage, a lower current limit threshold voltage is selected. When the input voltage and output voltage has a small differential voltage, an upper limit threshold voltage is selected.

12 Claims, 2 Drawing Sheets

US 6,947,272 B2

INRUSH CURRENT CONTROL METHOD USING A DUAL CURRENT LIMIT POWER SWITCH

This application claims priority under 35 USC § 119 (e)(1) of provisional application No. 60/331,804 filed Nov. 20, 2001.

FIELD OF THE INVENTION

This invention generally relates to electronic systems and in particular it relates to an inrush current control method using a dual current limit power switch.

BACKGROUND OF THE INVENTION

Many USB peripherals need bulk capacitance on the input voltage supply rail greater than 10 uF but the USB 1.0, 1.1, and 2.0 specifications require that peripherals not exceed a load of 10 uF in parallel with 44 ohms. When bulk capacitance is needed in a peripheral, a power switch is utilized and turned on slowly usually 1 ms to 2 ms to minimize the inrush current. This method is useful in most applications but does not solve the problem when very large input capacitors are used because the current through the power switch increases until the current limit is invoked between 0.7 A and 1 A which exceeds the 44 ohms specification required for USB peripherals.

FIG. 1 shows a simple circuit diagram of a prior art power distribution switch 20 along with resistor 22, capacitors 24, 26, and 28, and load 30 that is used in applications to minimize inrush currents to large capacitive loads 28 (e.g. 22 uF). The power distribution switch includes input node IN, output node OUT, enable node EN, over current signal node OC, and ground node GND. Large capacitors 28 are needed in distributed power systems to minimize voltage ripple and voltage spikes associated with load transients. Adding large capacitors to a distributed power system increases the inrush currents when powering up. One method to minimize inrush current is to employ a power switch that turns on slowly as shown by equation (1).

$$I(t) = C \cdot dV(t)/dt \quad (1)$$

I(t) is current, C is capacitance, and dV(t)/dt is the change in voltage with respect to time.

FIG. 2 shows an internal block diagram of the prior art power distribution switch of FIG. 1. The most important internal circuit blocks include the power switch (NMOS transistor 40), driver 42, charge pump 44, and current limit circuit 46. The circuit of FIG. 2 also includes thermal sense 48, current sense 50, UVLO 52, OR gate 54, transistor 56, diode 58, enable EN, output OUT, and over current signal node OC. The NMOS transistor 40 is used because it is more cost effective than a PMOS transistor for applications requiring higher currents. Since NMOS transistors require a positive gate to source voltage, a charge pump 44 is required to boost the driver output voltage above the input voltage supply IN. Driver 42 controls turn-on and turn-off of transistor 40. A weak (low current) driver 42 and charge pump 44 are used to turn on the power switch slowly. This slow turn on time is fixed internally and varies slightly over the input voltage and temperature. This fixed turn on time is a limitation for applications that have specifications for maximum allowable inrush currents and have requirements for wide variations of bulk capacitance, such as the Universal Serial Bus (USB). The current limit is fixed at a value that is sufficiently higher than the rated load current and does not add any inrush current control.

Another prior art method for inrush current control is to use a dual current limited switch that also turns on slowly to control the inrush current. FIG. 3 shows a prior art dual current limit solution. This solution consists of a power switch 70 (with similar internal functions as the device of FIG. 2) with adjustable current limit at node ILIM and an input voltage threshold circuit 72 that is used to adjust the current limit threshold by changing the current limit adjustment resistance that is set by resistors 74 and 76, and transistor 78. This method requires prior knowledge of the components and voltage levels to function appropriately in the application.

SUMMARY OF THE INVENTION

A current limit circuit regulates the current flow through a power switch by measuring the current through the switch and comparing it to a reference voltage that represents the limit current. When the current through the power switch is greater than the limit current, the current in the power switch is pulled lower by a driver circuit which controls the power switch. By using a current limit reference voltage that has two levels, the power switch has two current limit thresholds. Using a comparator to compare the input voltage of the power switch to the output voltage of the power switch, an output signal is generated to control the current limit threshold. When the input voltage and output voltage has a large differential voltage, a lower current limit threshold voltage is selected. When the input voltage and output voltage has a small differential voltage, an upper limit threshold voltage is selected.

DETAILED DESCRIPTION OF PREFERRED EMBODIMENTS

This invention solves the inrush current and maximum load requirements of the USB specification regardless of capacitance for USB peripherals by implementing a dual current limit in a power switch.

The preferred embodiment implements a dual, current-limited power switch. When the USB peripheral is initially connected to the USB system, the large bulk capacitance on the power switch output is at zero volts. The power switch is turned on slowly with the current limit set at the lower level of approximately 100 mA. The output capacitor voltage will slowly increase and the switch current will ramp until the 100 mA current limit. The switch will maintain the 100 mA current limit and output capacitor voltage will continue to increase, thus effectively limiting the capacitance load to resemble 44 ohms to the upstream USB power bus. When the output voltage reaches approximately 90% of the power switch input voltage, the switch will enable the upper current limit. Enabling the upper current limit makes available to the peripheral the full 500 mA when connected to a high-powered USB port.

Figure 1:
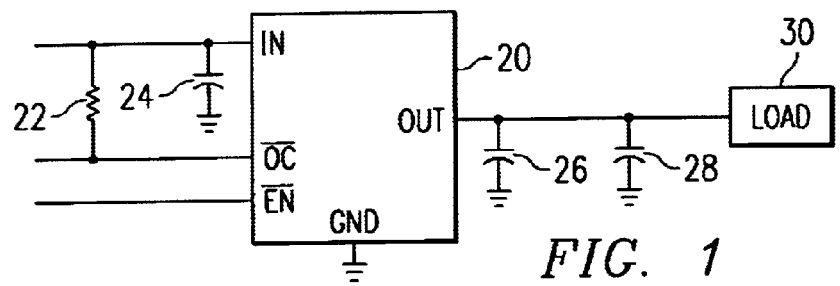
FIG. 1 is a schematic circuit diagram of a prior art power distribution switch.
Figure 2:
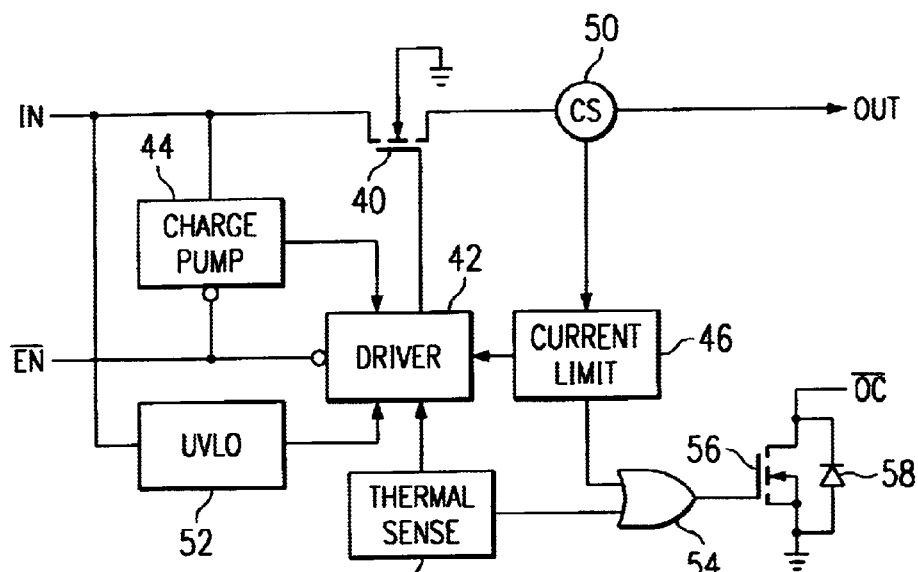
FIG. 2 is an internal block diagram of the prior art power distribution switch of FIG. 1.
Figure 3:
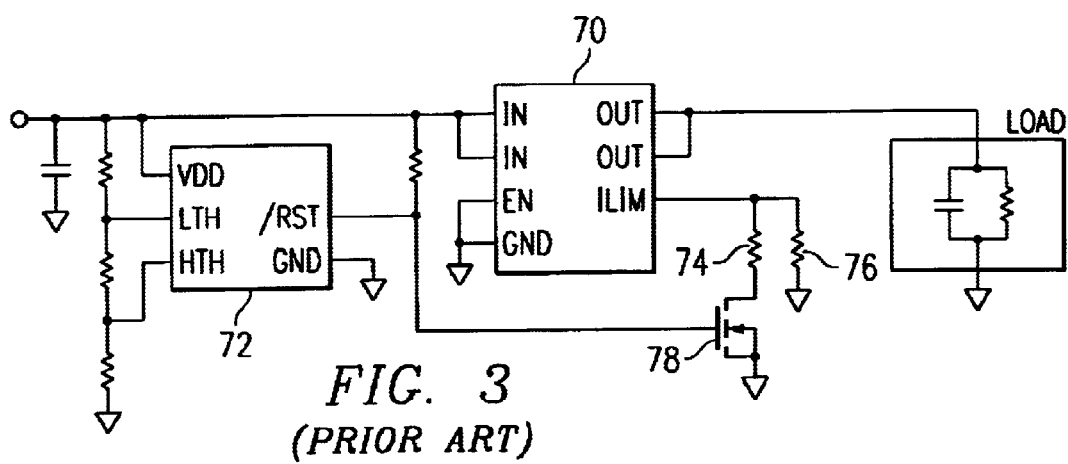
FIG. 3 is a schematic diagram of a prior art dual current limit solution.
Figure 4:
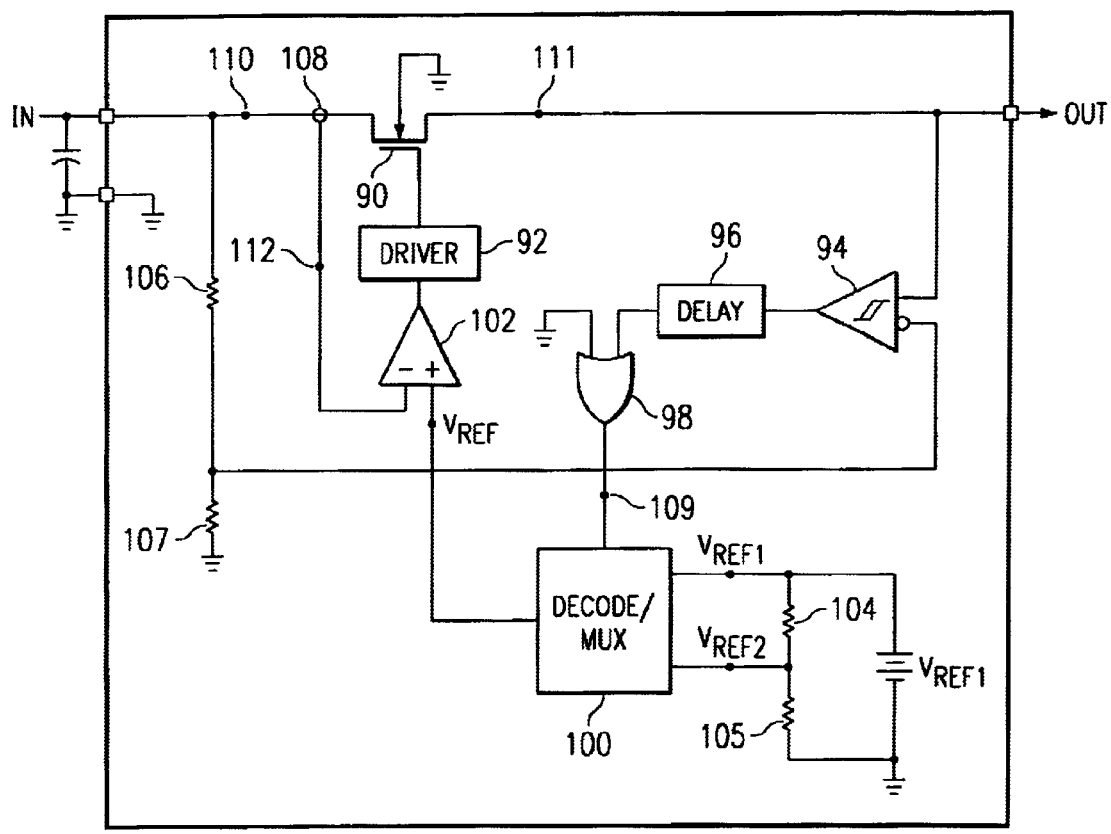
FIG. 4 is a schematic circuit diagram of a preferred embodiment dual current limit power switch.

A preferred embodiment inrush current control device is illustrated in FIG. 4. The critical elements are a power switch 90, charge pump (not shown), driver 92, and a dual current limit circuit that changes the current limit threshold.

Figure 5:
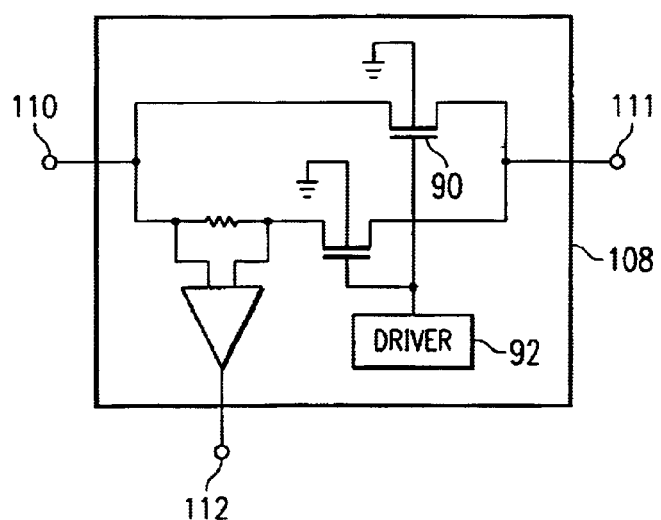
FIG. 5 is a schematic circuit diagram of an example current detection device.

The current limit circuit includes comparator 94, delay circuit 96, OR gate 98, decode/multiplexer 100, comparator 102, resistors 104–107, current detection device 108, and reference voltages VREF1 and VREF2. The current detection device 108 can be, for example, a circuit as shown in FIG. 5. Nodes 110–112 are the same in FIGS. 4 and 5. The current limit threshold should change from a lower current limit at startup to the upper limit once the output capacitor voltage reaches approximately the input voltage.

The power switch 90 is used to control the current flow from input to the output. Turning on the power switch allows current to flow, turning off the power switch restricts current from flowing from the input to the output. An NMOS power switch 90 (illustrated in FIG. 4) or PMOS power switch may be implemented. The NMOS 90 is more cost effective, but needs a charge pump to bias the driver to a voltage greater than the input voltage. The driver 92 applies a voltage to the gate of NMOS 90 that is higher than the input voltage IN (drain) to turn on the power switch 90, and applies the input voltage IN (or a voltage less than the input voltage IN) to the gate of NMOS power switch 90 to turn off the power switch 90. The current limit circuit controls the gate voltage to regulate the current flow through the NMOS power switch 90. The current limit circuit measures a voltage at device 108 that is proportional to the current through the switch 90 and compares it to a reference voltage $V_{REF}$ that represents the limit current. When the current through the power switch 90 is greater than the limit current, the gate voltage is pulled lower by the driver 92 to limit the current flow. By using a current limit reference voltage that has two levels $V_{REF1}$ and $V_{REF2}$, the power switch has two current limit thresholds. Using a comparator 94 to compare the input voltage IN to the output voltage OUT, an output signal is generated at node 109 to control the current limit threshold. When the input voltage IN and output voltage OUT has a large differential voltage, the lower current limit threshold voltage $V_{REF2}$ (<100 mA) is selected. When the output voltage OUT is approximately 90% of the input voltage IN, the upper limit threshold voltage $V_{REF1}$ (>0.5 A) is selected.

The preferred embodiment device of FIG. 4 uses a dual current limit power switch with switch output voltage as feedback. Prior art solutions regulating dv/dt or di/dt at the load fail to meet the requirement to not exceed a startup current of 100 mA. For both, there can be found a capacitive load where the current will, initially or during rampup, exceed the 100 mA by a considerable margin thereby violating the 10 uF in parallel with 44 ohms requirement.

The preferred embodiment solution of FIG. 4 does not require prior knowledge of the value of the load capacitor or input voltage to implement and meet the USB specification.

While this invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
   a switch;
   a first comparator coupled to the switch for comparing an input of the switch to an output of the switch;
   a current limit reference circuit coupled to the first comparator for providing a current reference that has a first reference level when a ratio of the output to the input is less than a fixed ratio, and a second reference level when the ratio of the output voltage to the input voltage is greater than the fixed ratio;
   a second comparator coupled to the current limit reference circuit for comparing the current reference to a current level in the switch;
   a driver circuit coupled between the second comparator and a control node of the switch;
   wherein the current limit reference circuit comprises a decode/multiplexer with two reference voltage inputs and an output coupled to an input of the second comparator;
   a logic gate having an output coupled to the decode/multiplexer; and
   a delay circuit coupled between an output of the first comparator and an input of the logic gate.

2. The device of claim 1 wherein the switch is a transistor.

3. The device of claim 1 wherein the switch is an NMOS transistor.

4. The device of claim 1 wherein the logic gate is an OR gate.

5. The device of claim 1 wherein the first comparator has a first input coupled to the output of the switch and a second input coupled to the input of the switch through a resistor divider circuit.

6. The device of claim 5 wherein the resistor divider circuit comprises:
   a first resistor coupled between the input of the switch and the second input of the first comparator; and
   a second resistor coupled between the second input of the first comparator and a ground node.

7. A dual current limit power switch device comprising:
   a power switch having an input node, an output node, and a control node;
   a driver coupled to the control node;
   a first comparator having an output coupled to the driver and a first input coupled to a current detection node at the input node of the power switch;
   a current limit reference circuit having an output coupled to a second input of the first comparator, and having a first input coupled to a first reference voltage node and a second input coupled to a second reference voltage node;
   a second comparator having a first input coupled to the output node of the power switch and a second input coupled to the input node of the power switch through a resistor divider, wherein the current limit reference circuit selects between the first and second reference voltages in response to the second comparator;
   a logic gate having an output coupled to the current limit reference circuit; and
   a delay circuit coupled between an output of the second comparator and an input of the logic gate.

8. The device of claim 7 wherein the logic gate is an OR gate having a first input coupled to the delay circuit and a second input coupled to a ground node.

9. The device of claim 7 wherein the power switch is a transistor.

10. The device of claim 7 wherein the power switch is an NMOS transistor.

11. The device of claim 7 wherein the current limit reference circuit is a decode/multiplexer.

12. The device of claim 7 wherein the resistor divider comprises:
   a first resistor coupled between the input node of the power switch and the second input of the second comparator; and
   a second resistor coupled between the second input of the second comparator and a ground node.

* * * * *